United States Patent [19]

Guckel et al.

[11] Patent Number: 5,013,693

[45] Date of Patent: May 7, 1991

[54] FORMATION OF MICROSTRUCTURES WITH REMOVAL OF LIQUID BY FREEZING AND SUBLIMATION

[75] Inventors: Henry Guckel; Jeffry Sniegowski, both of Madison, Wis.

[73] Assignee: Wisconsin Alumni Research Foundation, Madison, Wis.

[21] Appl. No.: 311,466

[22] Filed: Feb. 16, 1989

[51] Int. Cl.$^5$ .............................................. H01L 21/64
[52] U.S. Cl. .................................. 437/248; 437/901; 29/621.1
[58] Field of Search ................ 29/621.1; 437/901, 248; 73/754

[56] References Cited

U.S. PATENT DOCUMENTS

| 3,403,046 | 9/1968 | Schwacke et al. | 427/350 |
| 4,592,238 | 6/1986 | Busta | 29/621.1 |
| 4,744,863 | 5/1988 | Guckel et al. | 29/621.1 |

FOREIGN PATENT DOCUMENTS 62-169420  7/1987  Japan .

OTHER PUBLICATIONS

J. B. Lasky et al., "Silicon-On-Insulator (SOI) by Bonding and Etch-Back," Int. Elect. Dev. Meeting (IEDM), 1985, pp. 684–687.

Hiromichi Ohashi et al., "Improved Dielectrically Isolated Device Integration by Silicon-wafer Direct Bonding (SDB) Technique," Int. Elec. Dev. Meeting (IEDM), 1986, pp. 210–213.

M. Shimbo et al., "Silicon-to-Silicon Direct Bonding Method," J. Appl. Phys., vol. 60, No. 8, Oct. 15, 1986, pp. 2987–2989.

Deepak Nayak, "Metal-to-Metal Bonding Using an Oxidizing Ambient Atmosphere," J. Electrochem. Soc.: Solid-State Science & Technology, vol. 135, No. 4, Apr. 1988, pp. 1023–1025.

G. Gould et al., "An in situ Study of Aqueous HF Treatment of Silicon by Contact Angle Measurement and Ellipsometry," J. Electrochem. Soc.: Solid-State Science & Technology, vol. 135, No. 6, Jun. 1988, pp. 1535–1539.

H. Guckel et al., "Fine-Grained Polysilicon Films with Built-In Tensile Strain," IEEE Transactions on Electron Devices, vol. 35, No. 6, Jun. 1988.

H. Guckel et al., "Processing Conditions for Polysilicon Films with Tensile Strain for Large Aspect Ratio Microstructures", in Technical Digest 1988, Solid-State Sensor and Actuator Workshop, Hilton Head Island, S.C., Jun. 6–9, 1988, pp. 51–54.

H. Guckel et al., "Mechanical Properties of Fine Grained Polysilicon the Repeatability Issue," in Technical Digest, 1988 Solid-State Sensor Actuator Workshop, Hilton Head Island, S.C. Jun. 6–9, 1988, pp. 96–99.

*Primary Examiner*—Olik Chaudhuri
*Assistant Examiner*—G. Fourson
*Attorney, Agent, or Firm*—Foley & Lardner

[57] ABSTRACT

Micromechanical structures having surfaces closely spaced from surfaces of a substrate are formed using normal wet etching techniques but are not dried in a conventional manner. While the substrate with the microstructures formed thereon is still wet, the substrate is covered with a liquid that can be frozen, such as deionized water. The liquid on the flooded structure is then frozen in a well controlled manner such that freezing is completed before the microstructure is uncovered. The microstructures are therefore undeflected and are covered by a solid on all surfaces. This solid is then sublimated at a predetermined temperature. Because the frozen liquid (e.g., ice) supports its own surface tension, the microstructures are not drawn toward the substrate, as occurs with the drying of liquids. The sublimation of all the frozen liquid leaves undeflected microstructures with no permanent bonding of the facing surfaces of the microstructure and the substrate.

35 Claims, 1 Drawing Sheet

FORMATION OF MICROSTRUCTURES WITH REMOVAL OF LIQUID BY FREEZING AND SUBLIMATION

FIELD OF THE INVENTION

This invention pertains generally to the field of semiconductor devices and processing techniques for forming such devices, and to the formation of micromechanical structures on materials such as semiconductors.

BACKGROUND OF THE INVENTION

The formation of microelectronic devices on semiconductor substrates requires, for certain applications, the formation of mechanically isolated semiconductor microstructures, such as beam's and diaphragms. Such microstructures are important components of a variety of microsensors, including pressure transducers, strain sensors, and vapor and humidity sensors. Microstructures are currently being explored for applications beyond typical microelectronics devices, for example in the formation of micromachines which include highly miniturized parts such as gears and levers.

The formation of micromechanical devices and other microstructures in semiconductors often utilizes surface machining. Such machining operations begin with a stiff substrate, for example, a silicon wafer, which is covered by a sacrificial layer such as silicon dioxide. The sacrificial layer is typically quite thin, in the range of up to two microns or so, and in some cases even thinner. The sacrificial film layer is covered with the desired thin film mechanical construction material, for example, polycrystalline silicon (polysilicon). Thicknesses for the mechanical construction film are typically in the range of a few microns or less. The construction film is patterned into the desired mechanical structure, for example a doubly clamped beam with support pads which are much larger than the width of the beam. The sacrificial layer is then removed from the body of the beam by an etching step which does not attack the substrate or the construction film. The end result should be a freestanding beam, clamped at both ends, with an air gap between the beam and the substrate. The air gap is quite small, the thickness of the sacrificial layer. However, experience has shown that successful formation of such freestanding micromechanical beams only occurs reliably for structures which are relatively quite stiff and with relatively rough substrate and beam surfaces. Mechanically weak structures, which are the rule rather than the exception in micromechanical structures, normally deflect and attach themselves permanently to the substrate surface at all points at which the construction film and the substrate come into contact.

The problem of bonding between the construction film and the substrate is related to three physical phenomena. These are (1) surface bonding due to an etch residue compound left on hydrogen fluoride etched structures, (2) surface tension forces during the drying phase of the wet chemistry procedures used to create the isolated mechanical structure, and (3) electrostatically induced deflections due to built-up potentials between the free beam or diaphragm and the substrate.

Hydrofluoric acid, HF, is the only effective etchant presently used for silicon dioxide on silicon processing technology. It has been proposed that the HF etching process leaves a residue which is either a hydrocarbon or a fluorocarbon and which cannot be removed by extensive rinses with deionized water. See G. Gould, et al., "An In Situ Study of Aqueous HF Treatment of Silicon by Contact Angle Measurement and Ellipsometry," J. Electrochem. Soc.: Solid State Science and Technology, Vol. 135, No. 6, June 1988 pp. 1535-1539. Although the compound has not been identified, the experimental observations are consistent with this proposal. For example, if a doubly supported beam is etched free with a HF etching, and the resulting structure is dilution rinsed for up to two days without exposure to room ambient, drying of the structures will cause permanent attachment of the beam to the substrate.

It is noted that a wafer which is completely covered by a film of water cannot experience surface tension forces, and it will therefore exhibit undeflected beams during microscopic examination in the presence of water. If, however, the beams are dried and attach themselves to the substrate via chemical bonding, reimmersion of the wafer into water should not produce straight beams if the bonding compound is not water soluble. This result has, in fact, been observed. It has also been observed that the bonding compound is soluble in HF. Thus, bonded beams can be freed in water by first etching in HF and then following with a dilution rinse. The wafer will again exhibit straight beams as long as it is covered with water.

It is not surprising that two silicon surfaces in contact with one another bond chemically. The silicon chemical bonding effect is the basis for the concept of fusion bonding. In this technology clean, flat semiconductor wafers are first treated in acid baths to produce hydrophyllic surfaces after a subsequent wafer rinse. The wafers are then dried and wafer to wafer bonding occurs when the two polished surfaces are brought into contact. Room temperature adhesion is strong, and heating of the attached wafers to 1000° C. in nitrogen produces excellent stable bonding. The proposed chemical explanation for the bonding involves a hydroxide bond which decomposes thermally, which is somewhat in conflict with the proposed HF residue theory of bonding. In any event, the same type of bonding which is exploited to attach wafers to one another in fusion bonding must also occur for identical facing surfaces in micromechanical structures where such bonding is definitely not desired. It has been possible to treat the wafers chemically to avoid the surface bonding problem in dry ambients, which require that bondable surfaces cannot touch each other until the wafer is dry. This result has not been heretofore achieved in wet ambients.

SUMMARY OF THE INVENTION

In accordance with the present invention, microstructures having parts suspended over a substrate, with surfaces that face the substrate such as beams and diaphragms, are formed in a normal manner using wet etching techniques but are not dried in a conventional manner. After the normal rinsing steps and while the substrate with the microstructures formed thereon is still wet, the substrate is flooded with a liquid, which can be frozen such as deionized water. The liquid on the flooded structure is then frozen, either by directly cooling the structure or by vacuum pumping. The freezing process is carried out in a manner which is well controlled and is such that all freezing is completed before the microstructure is uncovered. The microstructure are therefore undeflected and covered by a solid on all surfaces. This solid, e.g., ice, is then sublimated at a predetermined temperature. Because the ice (or other frozen liquid), by definition of a solid, supports its own surface tension, there is little or no net force applied by the ice on the microstructure to draw the surfaces of the structure to the substrate, and the sublimation of all of the ice leaves undeflected microstructures with no bonding of the parts to the substrate.

The undeflected structures formed in the foregoing manner can be converted to nonbonding structures by proper treatment to render the facing surfaces nonbonding. For a variety of materials, including semiconductors such as silicon, heat treatment at elevated temperatures, e.g., 950° C., in ambients such as nitrogen or oxygen, will reduce the bonding behavior of the surfaces although bonding may not always be completely eliminated. After heat treatment, a suspended beam which is mechanically pressed into intimate contact with the substrate may partially adhere. However, the bonding is not permanent. Immersion of the structure in distilled deionized water will release the bond, whereas without the heat treatment the bond would not be released. The surfaces may also be passivated by coating them with a thin layer of silicon nitride deposited by a low pressure chemical vapor deposition (LPCVD) process. The silicon nitride deposition produces completely non-bonding surfaces. A beam passivated with silicon nitride will not adhere even when pressed into intimate contact with the substrate. In this manner, a variety of microstructures such as beams, diaphragms, gears, levers, bearings, and so forth can be readily formed in a manner compatible with conventional microelectronic processing techniques. The surfaces of the microstructures can be made as smooth as desired while nonetheless avoiding bonding, and rough surfaces are not required to avoid the bonding effects.

Further objects, features, and advantages of the invention will be apparent from the following detailed description when taken in conjunction with the accompanying drawings.

DESCRIPTION OF THE PREFERRED EMBODIMENT

Surface machined microstructures are subject to two forces: the electrostatic capacitor forces due to the built-in potential, and the surface tension forces due to the drying of a fluid on portions of the device. If the electrostatic forces are relatively small, a doubly clamped freestanding beam will be perfectly straight when completely covered by fluid. In the air drying of liquid from the device, the interfaces between the air, the device surface and the fluid will cause the device surfaces to experience surface tension forces. The magnitude of these forces will depend on the surface tension $\gamma$ of the fluid relative to the device surface, and the fluid-solid interface contact angle, $\theta c$. The surface tension force effect may be illustrated by assuming two very large flat plates which are separated by a cylindrical volume of fluid with a radius R and a thickness t. If the angle between one of the plates and the meniscus is $\theta c$ and the surface tension is $\gamma$, the component of force F perpendicular to the plate which is imposed on the plate in the direction of the fluid becomes:

$$F \approx 2\pi R \gamma \sin \theta_c$$

This force attracts the two plates to each other and is counter balanced by an internal pressure increase in the fluid. In micromechanical structures the situation is more complicated because the geometry is much more complex. However, the end result is fundamentally the same: beams will deflect towards the wafer or substrate surface during drying and will attach to the substrate surface by the surface bonding phenomenon discussed above.

Figure 1:
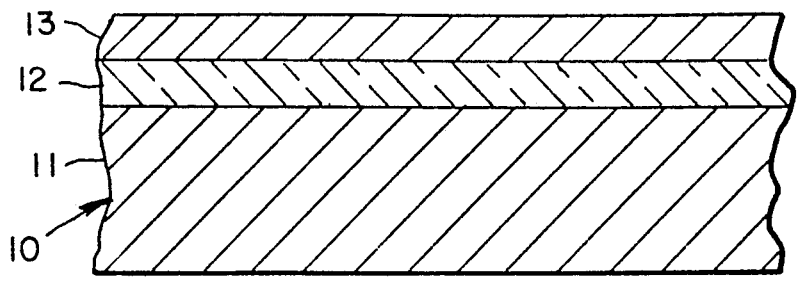
FIG. 1 is an illustrative view showing a cross section through a substrate of silicon having a sacrificial layer formed thereon and a thin polysilicon construction layer over the sacrificial layer.
Figure 2:
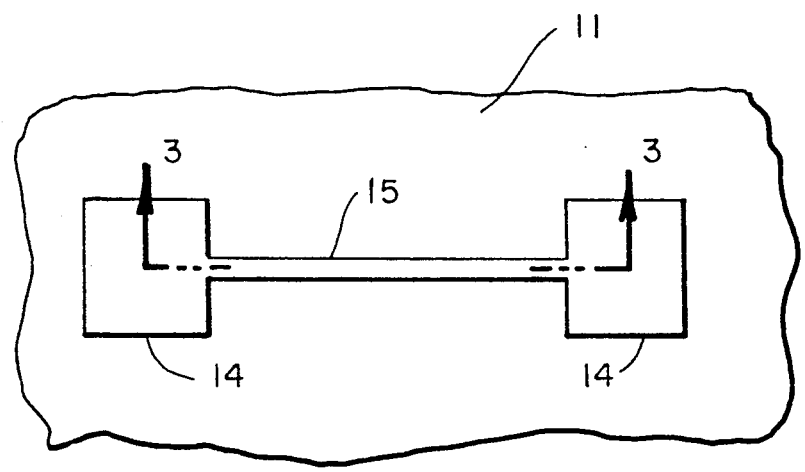
FIG. 2 is an illustrative plan view showing a doubly supported beam formed on the substrate of FIG. 1.
Figure 3:
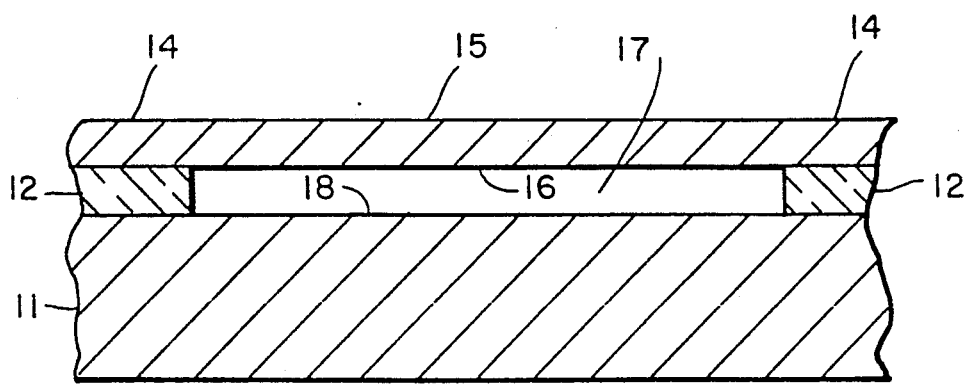
FIG. 3 is a cross sectional view through the doubly supported beam of FIG. 2, taken generally along the lines 3—3 of FIG. 2.

For purposes of illustrating the principles of the invention, the formation of a typical microstructure, a doubly supported beam, is shown in FIG. 1-3. The initial unworked structure 10 is shown in FIG. 1, composed of a wafer of single crystal silicon 11 constituting the substrate, a thin layer of silicon dioxide 12 (e.g., a micron in thickness or less), and a thin layer 13 of construction material, such as polysilicon which will constitute the material of the microstructure. As shown in FIG. 2, the polysilicon layer 13 may be patterned to form a doubly supported beam having large pads 14 at its outer ends and a beam structure 15 having a bottom surface 16 which spans a cavity 17 as best shown in FIG. 3. The silicon dioxide layer 12 remains under the pads 14 to support the beam 15 away from the surface 18 of the substrate 11. The separation between the lower surface 16 of the beam 15 and the facing upper surface 18 of the substrate is therefore quite small, typically in the range of a few microns, while the beam 15 may be a few microns in thickness and many tens or hundreds of microns in length. Thus, relatively small deflections of the beam 15 can bring portions of the surface of the beam in contact with the top surfaces 18 of the substrate, resulting in the bonding phenomena. This commonly occurs in the conventional formation of micromechanical beam structures.

Because of the relatively small separation between the bottom surface of the beam and the top surface of the substrate, typically a micron or less, a layer of liquid can occupy the space 17 between the beam and the substrate and be held therein by capillarity, and will exert relatively strong surface tension forces on the beam as the liquid (usually deionized water) dries. The bonding phenomenon can be minimized or avoided by roughening the surfaces of the substrate 18 and the facing surface 16 of the beam, but such rough surface often yield an undesirable structure, and the rough surfaces may be difficult or impossible to form in a controlled manner given the very small dimensions of the microstructures that are being produced.

In the process of the present invention, the microstructure such as the beam shown in FIGS. 2 and 3 can be formed by patterning the mechanical construction film 13 in the conventional manner, etching away the construction film to leave the patterned beam and supports, and then etching away the sacrificial silicon dioxide layer 12 under the beam 15 to leave the beam freely suspended. This process is, of course, carried out with liquid etchants and the beam 15 always remains immersed in a liquid until final rinsing and drying of the rinsing liquid (usually dionized water) is completed. Techniques of forming beams, diaphragms and other microstructures is well known in the semiconductor processing industry. A preferred technique for forming structures such as diaphragms is described in U.S. Pat. No. 4,744,863, issued May 17, 1988 to Guckel, et al., which is incorporated herein by reference.

In the present invention, after the thorough rinsing with deionized water has taken place, the wafer or substrate with the microstructure thereon is flooded with a liquid which is capable of freezing in a controlled manner, such as deionized water to which a small amount of methanol has been added. The methanol acts to provide nucleation centers for formation of ice in the deionized water and prevents supercooling. The flooded structure is then inserted into a vacuum system with e.g., a 50 liters per second forepump. The wetted wafer is supported on three insulating posts for thermal isolation. The vacuum chamber is then sealed and vacuum pumping started which produces evaporation and therefore rapid cooling of the liquid covering the wafer. Direct cooling of the wafer using refrigeration techniques may also be used to freeze the liquid. The freezing of the liquid occurs in a controlled manner and the conditions of cooling and evaporation are adjusted so that freezing of the liquid is completed before the microstructure on the substrate is uncovered. The solid ice therefore "freezes" the microstructures in their undeflected positions and with the ice covering all of the structural surfaces. The solid ice is then sublimated at a preselected temperature. For example, the ice may be sublimated at 0° C., which allows rapid sublimation since the vapor pressure of ice at 0° C. is 4.6 mm of mercury. After all the ice has been removed by sublimation, the substrate with the micromechanical devices thereon is removed from the vacuum system. The substrate is now dry and undeflected microstructures exist on it.

To stabilize the surfaces of the microstructures so that subsequent deflections do not result in the surface bonding phenomena, the wafer may be treated in various ways to passivate the surface and inhibit bonding. For example, with typical semiconductor materials, such as silicon, the wafers may be placed in an oven and heated for a period of time sufficient to passivate the surfaces, e.g., at 950° C. in a nitrogen or oxygen ambient atmosphere. A thin layer of silicon nitride may also be LPCVD deposited as described in the foregoing U.S. Pat. No. 4,744,863, to passivate the surfaces.

Liquids other than water can be utilized as the freezable liquid of the present invention and will yield the same result, the removal of the fluid from the wafers while avoiding surface tension forces.

The following is an example of formation of microstructures in accordance with the present invention using a typical semiconductor material, silicon.

The vacuum system used included a Leybold-Haraeus Model D60 AC direct drive rotary vane pump, rated at 1004 liters per minute (36.7 cubic feet per minute). The vacuum chamber had a clear viewing port above the semiconductor wafer to be treated, and had a chamber diameter of 22.0 centimeters (cm), a height of 5.0 cm, and a volume of 1900 cm$^3$. The center support had a diameter of 12.5 cm, a height of 1.5 cm and a volume of 184 cm$^3$. The effective chamber volume was thus 1717 cm$^3$. The pressure and gas fl w control systems were of standard design, displaying pressure units in millibars, and had Tylan Mass Flow Controllers Units (standard cubic centimeters per minute, sccm) for gas (e.g., nitrogen) flow control.

The following sequence describes processing steps from the point at which the sacrificial layer has been removed and the wafer has been rinsed but is still immersed in the rinse liquid. The processing steps for producing such free-standing structures are described, for example, in U.S. Pat. No. 4,744,863.

The wafer is left in the rinse liquid, de-ionized water (DI-water), until a sufficient native oxide grows to produce a hydrophillic surface, i.e., the surface wets. This insures that the surfaces remain under liquid during subsequent transfers from the beaker in which the wafer is contained. The wafer is then transferred to a beaker containing a solution of methanol and DI-water in the ratio 1:2. It remains in this bath for ten minutes to assure a thorough mixing of the rinse water which was on the surface. The wafer is then pulled vertically from the methanol: DI-water bath and placed immediately onto the three thermal isolation stand-offs in the vacuum chamber. The liquid carried along on the wetted wafer surface is sufficient for the freeze cycle, i.e., no additional liquid is necessary. The clear chamber cover is placed into position and pumping down to the preset pressure of 0.15 millibar immediately follows. Freezing occurs within seconds. The setpoints of 0.15 millibar pressure and 5.0 sccm (standard cubic centimeters per minute) dry nitrogen flow into the chamber are determined experimentally to be satisfactory. This produces an ice which is solid enough to support the structures while maximizing the sublimation rate.

Once the ice visually disappears from the wafer surface, the wafer is left in the system for an additional period of time (usually around or somewhat greater than 15 minutes) to allow the wafer to come to approximately room temperature to prevent condensation of water from the atmosphere. When doubly supported beams are formed in this manner, an inspection at this point in the process shows that the beams are up, away from the substrate, but by forcing them into contact with the substrate an adhesion process occurs which is self promoting and can be seen as a traveling adhesion front as the beam sticks itself down from its initial point of contact until the entire beam is attached.

The wafer is then transferred to a steam oxidation furnace. A thin (about 130 angstroms) wet thermal oxide is grown in ten minutes at 835° C. A fifteen minute anneal under dry nitrogen flow follows the oxidation. The oxide serves as a strain-relief layer between the polysilicon and silicon nitride to be deposited. Next, the wafer is transferred to a silicon nitride deposition reactor and a low pressure chemical vapor deposited (LPCVD) silicon nitride film is grown. Dichlorosilane and ammonia gas flows are controlled in the reactor to produce a non-stoichiometric silicon nitride film which is relatively strain-free. The film thickness resulting from ten minutes of deposition at 835° C. is approximately 360 angstroms.

At this point in time, the wafer is removed from the reactor and is ready for further processing. It is noted that after application of the nitride film, the beams can be forced into contact with the substrate and will not adhere at any point along their length.

The electrostatic effects which may tend to draw microstructural parts together are familiar in microelectronic semiconductor device processing. The built-in electrostatic potentials result in built-in fields which typically emanate from one part of the structure and terminate on another part. They produce forces which are similar to the forces which occur between the plates of a parallel plate capacitor when an external voltage is applied. However, in micromechanical structures the built-in fields can lead to deflections because the structures have limited rigidity, and such forces are particularly felt in extremely long and thin structures such as doubly supported beams. If a built-in potential is present between the beam and the substrate, the gap between the two will have an electric field E, which produces an attractive pressure of $\frac{1}{2}\epsilon$ $E^2$ where $\epsilon$ is the permittivity of the gap. The resulting attractive force causes a beam deflection, and any increase in the deflection increases the electrostatic pressure, resulting in a potential instability. If the built-in potential is too large, the beam will deflect fully and touch the substrate, resulting in the bonding phenomenon between the two parts where they touch. If the potential is relatively small, small beam deflection without contact will result.

Electrostatic interaction does occur even when the micromechanical parts are flooded by a liquid. If the electrostatic deflection is large, the beam will deflect sufficiently to cause contact and the resulting surface bonding. However if the beam or other micromechanical part deflects only mildly in the fluid used to clean the part, the parts will not contact each other, and the freeze-sublimation cycle of the present invention will produce a dry structure which has a gap between the facing surfaces microstructures and the substrate. Control of the deflection of the beam (or diaphragm, etc.) can be obtained by proper selection of the cleaning fluid and proper device design. If the resulting structure retains a gap so that it is not bonded when dry, the bonding problem for this structure can be eliminated by subsequent passivation of the surfaces, such as by heat treatments. Thereafter, deflections of the beam having passivated surfaces to touch-down will produce one of two effects: (1) a sufficiently rigid structure will spring back after the external force on the beam has been removed, and (2) a less rigid structure or one with a large built-in potential will attach itself to the substrate by electrostatic forces but not by bonding. A device which has the structural parts electrostatically bonded together, but which is not chemically bonded, can be forced to deflect back into a new state, where the parts are separated by a gap, by applying an external bias between the microstructure and the substrate to essentially cancel the electrostatic forces between these structures.

It is understood that the invention is not confined to the particular embodiment herein illustrated and described, but embraces such modified forms thereof as come within the scope of the following claims.

What is claimed is:

1. A method of producing a stable microstructure having a surface which is closely spaced to and faces a surface of a substrate and which has been formed by a liquid etching process such that the microstructure can deflect to contact the substrate if the liquid is dried from the substrate and microstructure, comprising the steps of:
    (a) maintaining the substrate and microstructure in a freezable liquid so that the microstructure is not dried out after it is formed;
    (b) freezing the liquid on the microstructure and the substrate;
    (c) sublimating the frozen liquid from the microstructure and the substrate.

2. The method of claim 1 wherein the freezable liquid comprises water.

3. The method of claim 2 wherein the freezable liquid comprises deionized water with a nucleation enhancing material dissolved therein.

4. The method of claim 3 wherein the nucleation enhancing material is methanol.

5. The method of claim 1 wherein the step of freezing the freezable liquid is carried out by placing the substrate and microstructure, covered with the liquid, into a chamber and evacuating the chamber.

6. The method of claim 1 wherein the substrate comprises silicon and the microstructure also comprises silicon.

7. The method of claim 1 including, after the step of sublimating, the additional step of passivating the facing surfaces of the substrate and the microstructure so that subsequent contact between the surfaces does not lead to surface bonding between the facing surfaces.

8. The method of claim 7 wherein the step of passivating the facing surfaces is carried out by low pressure chemical vapor deposition of a thin layer of silicon nitride onto the surfaces.

9. The method of claim 7 wherein the step of passivating the facing surfaces is carried out by subjecting the substrate with the microstructure thereon to elevated temperatures in a desired ambient atmosphere for a period of time sufficient to passivate the surfaces.

10. The method of claim 9 wherein the ambient atmosphere is selected from the group consisting of oxygen and nitrogen.

11. The method of claim 1 wherein the spacing between the facing surfaces of the microstructure and the substrate is on the order of a micron or less.

12. A method of producing a stable microstructure on a substrate wherein the microstructure has a surface which is closely spaced to and faces a surface of the substrate, wherein the microstructure is formed in a liquid and such that the microstructure can deflect to contact the substrate if the liquid is dried from the microstructure and substrate, comprising the steps of:
    (a) maintaining the substrate and the microstructure thereon in a freezable liquid so that the microstructure is not dried out after it is formed;
    (b) freezing the liquid on the microstructure and the substrate;
    (c) sublimating the liquid from the microstructure and substrate; and
    (d) passivating the facing surfaces of the microstructure and the substrate so that subsequent contact between such surfaces does not result in surface bonding.

13. The method of claim 12 wherein the freezable liquid comprises water.

14. The method of claim 13 wherein the freezable liquid comprises deionized water with a nucleation enhancing material dissolved therein.

15. The method of claim 14 wherein the nucleation enhancing material is methanol.

16. The method of claim 12 wherein the step of freezing the freezable liquid is carried out by placing the substrate with the microstructure flooded with the liquid thereon into a chamber and evacuating the chamber.

17. The method of claim 12 wherein the substrate comprises silicon and the microstructure also comprises silicon.

18. The method of claim 12 wherein the step of passivating the facing surfaces is carried out by subjecting the substrate with the microstructure thereon to elevated temperatures in a desired ambient atmosphere for a period of time sufficient to passivate the surfaces.

19. The method of claim 18 wherein the ambient atmosphere is selected from the group consisting of oxygen and nitrogen.

20. The method of claim 12 wherein the step of passivating the facing surfaces is carried out by low pressure chemical vapor deposition of a thin layer of silicon nitride onto the surfaces.

21. The method of claim 12 wherein the spacing between the facing surfaces of the microstructure and substrate is on the order of one micron or less.

22. A method of producing a microstructure which has been formed on a silicon substrate by liquid etching processes which result in closely spaced facing surfaces on the microstructure and substrate such that the microstructure can deflect to contact the substrate if the liquid is dried from the substrate and microstructure, comprising the steps of:
 (a) maintaining the substrate and microstructure in a freezable liquid so that the microstructure is not dried out after it is formed;
 (b) freezing the liquid on the microstructure and substrate;
 (c) sublimating the frozen liquid to leave the microstructure isolated on the silicon substrate.

23. The method of claim 22 wherein the freezable liquid comprises water.

24. The method of claim 23 wherein the freezable liquid comprises deionized water with a nucleation enhancing material dissolved therein.

25. The method of claim 24 wherein the nucleation enhancing material is methanol.

26. The method of claim 22 wherein the step of freezing the freezable liquid is carried out by placing the substrate and the microstructure with the liquid thereon into a chamber and evacuating the chamber.

27. The method of claim 22 wherein the microstructure comprises polysilicon.

28. The method of claim 22 including, after the step of sublimating, the additional step of passivating the facing surfaces of the substrate and the microstructure so that subsequent contact between the surfaces does not lead to surface bonding between the facing surfaces.

29. The method of claim 28 wherein the step of passivating the facing surfaces is carried out by subjecting the substrate with the microstructure thereon to elevated temperatures in a desired ambient atmosphere for a period of time sufficient to passivate the surfaces.

30. The method of claim 22 wherein the microstructure formed on the silicon substrate comprises a beam supported at each end by a pad which is supported on the substrate such that the bottom surface of the beam and the top surface of the silicon substrate are closely spaced from one another.

31. The method of claim 28 wherein the step of passivating the facing surfaces is carried out by low pressure chemical vapor deposition of a thin layer of silicon nitride onto the surfaces.

32. The method of claim 22 wherein the microstructure formed on the silicon substrate is a diaphragm having relatively large dimensions compared to its thickness which is supported at its edges on the silicon substrate.

33. The method of claim 30 wherein the beam has a thickness in the range of 1 to 4 microns and a length of at least 50 microns.

34. The method of claim 32 wherein the diaphragm has a thickness in the range of 1 to 4 microns and a width of at least 50 microns.

35. The method of claim 22 wherein the facing surfaces of the microstructure and substrate are spaced from each other on the order of one micron or less.

* * * * *